United States Patent [19]
Yamamoto et al.

[11] Patent Number: 5,966,174
[45] Date of Patent: Oct. 12, 1999

[54] SIGNAL PROCESSING CIRCUIT AND METHOD FOR DRIVING A SOLID STATE IMAGING DEVICE USING PLURAL READING OPERATIONS PER IMAGE SCANNING TIME

[75] Inventors: Yasutoshi Yamamoto, Hirakata; Masayuki Yoneyama, Takatsuki; Hiroyoshi Komobuchi, Kyoto; Yuji Matsuda, Takatsuki; Toshiya Fujii, Neyagawa, all of Japan

[73] Assignee: Matsushita Electric Industrial Co., Ltd., Osaka, Japan

[21] Appl. No.: 08/779,333

[22] Filed: Jan. 6, 1997

Related U.S. Application Data

[63] Continuation of application No. 08/449,742, May 25, 1995, abandoned.

[30] Foreign Application Priority Data

May 27, 1994 [JP] Japan ..................................... 6-115340

[51] Int. Cl.[6] .............................. H04N 5/335; H04N 9/64
[52] U.S. Cl. .......................... 348/319; 348/242; 348/273; 348/298; 348/321; 348/323
[58] Field of Search .................................... 348/294, 311, 348/316, 317, 318, 319, 320, 321, 322, 323, 297, 298, 241, 242, 250, 272, 273, 279, 280; H04N 5/335

[56] References Cited

U.S. PATENT DOCUMENTS

| | | | |
|---|---|---|---|
| 4,467,347 | 8/1984 | Ozawa et al. ............................. | 358/44 |
| 4,472,741 | 9/1984 | Takatsu et al. .......................... | 358/213 |
| 4,539,598 | 9/1985 | Dietrich et al. ......................... | 358/213 |
| 4,584,606 | 4/1986 | Nagasaki ................................. | 358/209 |
| 4,809,073 | 2/1989 | Chiba et al. ....................... | 358/213.13 |
| 4,837,630 | 6/1989 | Ueda .................................. | 358/213.26 |
| 4,862,487 | 8/1989 | Ando et al. ............................... | 377/58 |
| 4,985,758 | 1/1991 | Hashimoto ............................... | 358/44 |
| 5,027,218 | 6/1991 | Ueda .................................. | 358/213.23 |
| 5,148,013 | 9/1992 | Yamada ............................... | 250/208.1 |
| 5,233,428 | 8/1993 | Alford et al. ....................... | 358/213.19 |
| 5,247,366 | 9/1993 | Ginosar et al. .......................... | 358/209 |
| 5,258,834 | 11/1993 | Tsuji et al. ............................... | 358/98 |
| 5,396,091 | 3/1995 | Kobayashi et al. ...................... | 257/241 |
| 5,420,635 | 5/1995 | Konishi et al. .......................... | 348/362 |
| 5,488,416 | 1/1996 | Kyuma .................................... | 348/296 |
| 5,663,761 | 9/1997 | Fukui ..................................... | 348/323 |

FOREIGN PATENT DOCUMENTS

| | | | |
|---|---|---|---|
| 0487332 | 5/1992 | European Pat. Off. ......... | H04N 3/15 |
| 0595299 | 5/1994 | European Pat. Off. ....... | H04N 5/235 |
| 595299A2 | 5/1994 | European Pat. Off. ....... | H04N 5/235 |
| 2-87785 | 3/1990 | Japan ............................. | H04N 5/335 |
| 4-298175 | 10/1992 | Japan ............................. | H04N 5/335 |
| 6-113207 | 4/1994 | Japan ............................. | H04N 5/335 |

OTHER PUBLICATIONS

European Search Report, Sep. 1, 1995.

*Primary Examiner*—Wendy Garber
*Assistant Examiner*—Ngoc-Yen Vu
*Attorney, Agent, or Firm*—Ratner & Prestia

[57] ABSTRACT

A solid-state imaging apparatus includes a solid-state imaging device and a signal processing circuit. The solid-state imaging device includes: a plurality of photoelectric converting sections provided with color filters having different spectroscopic characteristics, and each converting light incident thereon into a charge and accumulating the charge, and a plurality of vertical charge transfer sections for vertically transferring the charge read from each of the photoelectric converting sections. A plurality of reading operations to read the charges accumulated in the photoelectric converting sections to the plurality of the vertical charge transfer sections are performed within a time duration for scanning an image for one image plane, and the charges read from the photoelectric converting sections are transferred through the vertical charge transfer section separately for each of the reading operations. The signal processing circuit includes: a plurality of color separation circuits each for performing color separation of signals based on the charges read by the plurality of reading operations and transferred separately; and a synthesis circuit for synthesizing the signals sent by the color separation circuits and outputting the resultant signal.

18 Claims, 13 Drawing Sheets

SIGNAL PROCESSING CIRCUIT AND METHOD FOR DRIVING A SOLID STATE IMAGING DEVICE USING PLURAL READING OPERATIONS PER IMAGE SCANNING TIME

This application is a continuation of application Ser. No. 08/449,742 filed May 25, 1995. Now abandoned.

BACKGROUND OF THE INVENTION

1. Field of the Invention

The present invention relates to a solid-state imaging apparatus having a solid-state imaging device and a signal processing circuit, used in a video camera and the like and a method for driving the solid-state imaging device.

2. Description of the Related Art

Recently, solid-state imaging devices and signal processing circuits used for such solid-state imaging devices has been improved in performance and are in use in a video camera for consumer use.

A conventional solid-state imaging device and a signal processing circuit used for such a solid-state imaging device described in Japanese Laid-Open Patent Publication No. 2-87685 will be described with reference to FIG. 18.

Such a conventional solid-state imaging device includes photoelectric converting sections arranged two dimensionally and a vertical charge transfer section for vertically transferring charges which are output by the photoelectric converting sections. A plurality of reading operations are performed within a period in which images corresponding to one image plane are formed, and the charges which are output are mixed in the vertical charge transfer section. The vertical charge transfer section outputs the result.

For example, the two reading operations are performed within the above-described period. A charge Q1 read in the first reading operation is accumulated in time duration t1, and a charge Q2 read in the second reading operation is accumulated in time duration t2, which is different from time duration t1. FIG. 18 illustrates the photoelectric converting characteristic of the conventional solid-state imaging device. In FIG. 18, the vertical axis represents the intensity of light, and the horizontal axis represents the level of the voltage obtained by converting the quantity of the output charge. The solid line indicates such a characteristic of the charge Q1, and the dashed line indicates such a characteristic of the charge Q2. The chain line represents such a characteristic of a charge Q3 obtained as a result of the mixture of the charges Q1 and Q2. As is illustrated in FIG. 18, the voltage based on the charge Q1 which is output in the first reading operation reaches a saturation level of the photoelectric converting section when the intensity of light becomes B. The voltage based on the charge Q2 which is output in the second reading operation reaches a saturation level of the photoelectric converting section when the intensity of light becomes D. The charge Q2 provides a wide dynamic range, but provides a low S/N ratio when the intensity of light is low due to the low signal level thereof. The charge Q1 provides a narrow dynamic range, but provides a high S/N ratio due to the high signal level thereof. Thus, the charge Q3 provides a wide dynamic range and a high S/N ratio even if the intensity of light is low.

A solid-state imaging apparatus having the above-described structure has drawbacks. Specifically, the saturation levels of the photoelectric converting sections corresponding to different pixels are not uniform. Thus, the knee point of the charge Q3 at which the curve representing the photoelectric converting characteristic turns drastically is different among different pixels. Such non-uniformity is represented as noise having a fixed pattern in an area of a video image having a high luminance, which significantly deteriorates the quality of the image.

Moreover, in the case where a plurality of color filters having different spectroscopic characteristics are provided in order to display a color image by a single solid-state imaging apparatus, color separation cannot be done due to the photoelectric converting characteristic having a knee point.

SUMMARY OF THE INVENTION

A method for driving a solid-state imaging device is provided. The solid-state imaging device includes a plurality of photoelectric converting sections arranged two dimensionally and respectively corresponding to a plurality of pixels, and a vertical charge transfer section for vertically transferring a charge read from each of the photoelectric converting sections. The method of the invention includes the steps of: performing a plurality of reading operations within a time duration for scanning an image for one image plane, thereby reading charges accumulated in the photoelectric converting sections to the vertical charge transfer section; and transferring the charges read from the photoelectric converting sections through the vertical charge transfer section separately for each of the reading operations.

According to another aspect of the invention, a solid-state imaging apparatus is provided. The solid-state imaging apparatus includes a solid-state imaging device and a signal processing circuit. The solid-state imaging device includes: a plurality of photoelectric converting sections provided with color filters having different spectroscopic characteristics, and each converting light incident thereon into a charge and accumulating the charge, and a plurality of vertical charge transfer sections for vertically transferring the charge read from each of the photoelectric converting sections. A plurality of reading operations to read the charges accumulated in the photoelectric converting sections to the plurality of the vertical charge transfer sections are performed within a time duration for scanning an image for one image plane, and the charges read from the photoelectric converting sections are transferred through the vertical charge transfer section separately for each of the reading operations. The signal processing circuit including: a plurality of color separation circuits each for performing color separation of signals based on the charges read by the plurality of reading operations and transferred separately; and a synthesis circuit for synthesizing the signals sent by the color separation circuits and outputting the resultant signal.

In one embodiment of the invention, the charges from fewer than all the photoelectric converting sections are read in at least one of the plurality of reading operations.

In another embodiment of the invention, the charges from all the photoelectric converting sections are read in each of the plurality of the reading operations.

In still another embodiment of the invention, the charges from at least two adjacent photoelectric converting sections in each of the plurality of reading operations are mixed together in the vertical charge transfer section.

In still another embodiment of the invention, the charges from at least two adjacent photoelectric converting sections in at least one of the plurality of reading operations are mixed together in the vertical charge transfer section, and the charges read in the remaining reading operations are vertically transferred with no mixture.

In still another embodiment of the invention, the photoelectric converting sections are provided with color filters having different spectroscopic characteristics from one another.

In still another embodiment of the invention, the image for one image plane is scanned within one field in a television scanning system.

In still another embodiment of the invention, the solid-state imaging device is irradiated by light for different time durations for the plurality of reading operations.

In still another embodiment of the invention; the plurality of reading operations are performed within a vertical blanking period in a television scanning system.

According to still another aspect of the invention, a solid-state imaging apparatus is provided. The solid-state imaging apparatus includes a solid-state imaging device and a signal processing circuit. The solid-state imaging device includes: a plurality of photoelectric converting sections provided with color filters having different spectroscopic characteristics, and each converting light incident thereon into a charge and accumulating the charge, and a plurality of vertical charge transfer sections for vertically transferring the charge read from each of the photoelectric converting sections. A plurality of reading operations to read the charges accumulated in the photoelectric converting sections to the plurality of the vertical charge transfer sections are performed within a time duration for scanning an image for one image plane, and the charges read from the photoelectric converting sections are transferred through the vertical charge transfer section separately for each of the reading operations. The signal processing circuit includes: a synthesis circuit for synthesizing signals based on the charges read by the plurality of reading operations and transferred separately, and a color separation circuit for performing color separation of the signals sent by the synthesis circuit and outputting the resultant signals.

In one embodiment of the invention, the synthesis circuit includes: a clip circuit for receiving a first part of the signals based on the charges read by the plurality of reading operations and transferred separately and clipping the signals each having a level exceeding a prescribed level to reduce the levels of such signals to the prescribed level; an addition circuit for adding the signals sent by the clip circuit and a second part of the signals; and a tone compensation circuit for compensating for tone characteristics of the signals sent by the addition circuit.

In another embodiment of the invention, the synthesis circuit includes: an amplification circuit for receiving a first part of the signals based on the charges read by the plurality of reading operations and transferred separately and amplifying the first part of the signals at a constant amplification factor; a comparison circuit for comparing a second part of the signals with a reference signal level; and a selection circuit for selecting one of the first part and the second part, based on the output from the comparison circuit.

In still another embodiment of the invention, the synthesis circuit includes: a subtraction circuit for subtracting a second part of the signals based on the charges read by the plurality of reading operations and transferred separately from a first part of the signals; an amplification circuit for amplifying the second part of the signals at a constant amplification factor; a comparison circuit for comparing the first part of the signals with a reference signal level; and a selection circuit for selecting one of the signals sent by the amplification circuit and the signals sent by the subtraction circuit, based on the output from the comparison circuit.

Thus, the invention described herein makes possible the advantages of (1) providing a solid-state imaging apparatus and a method for driving the solid-state imaging device for substantially eliminating deterioration of the image quality caused by non-uniform saturation levels in the photoelectric converting sections; and (2) providing a solid-state imaging apparatus and a method for driving the solid-state imaging device for displaying a color image using a plurality of color filters having different spectroscopic characteristics.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

EXAMPLE 1

With reference to FIGS. 1 through 4, a solid-state imaging apparatus in a first example according to the present invention will be described. In this specification, a solid-state imaging apparatus includes a solid-state imaging device and a signal processing circuit used for the solid-state imaging device.

Figure 1:
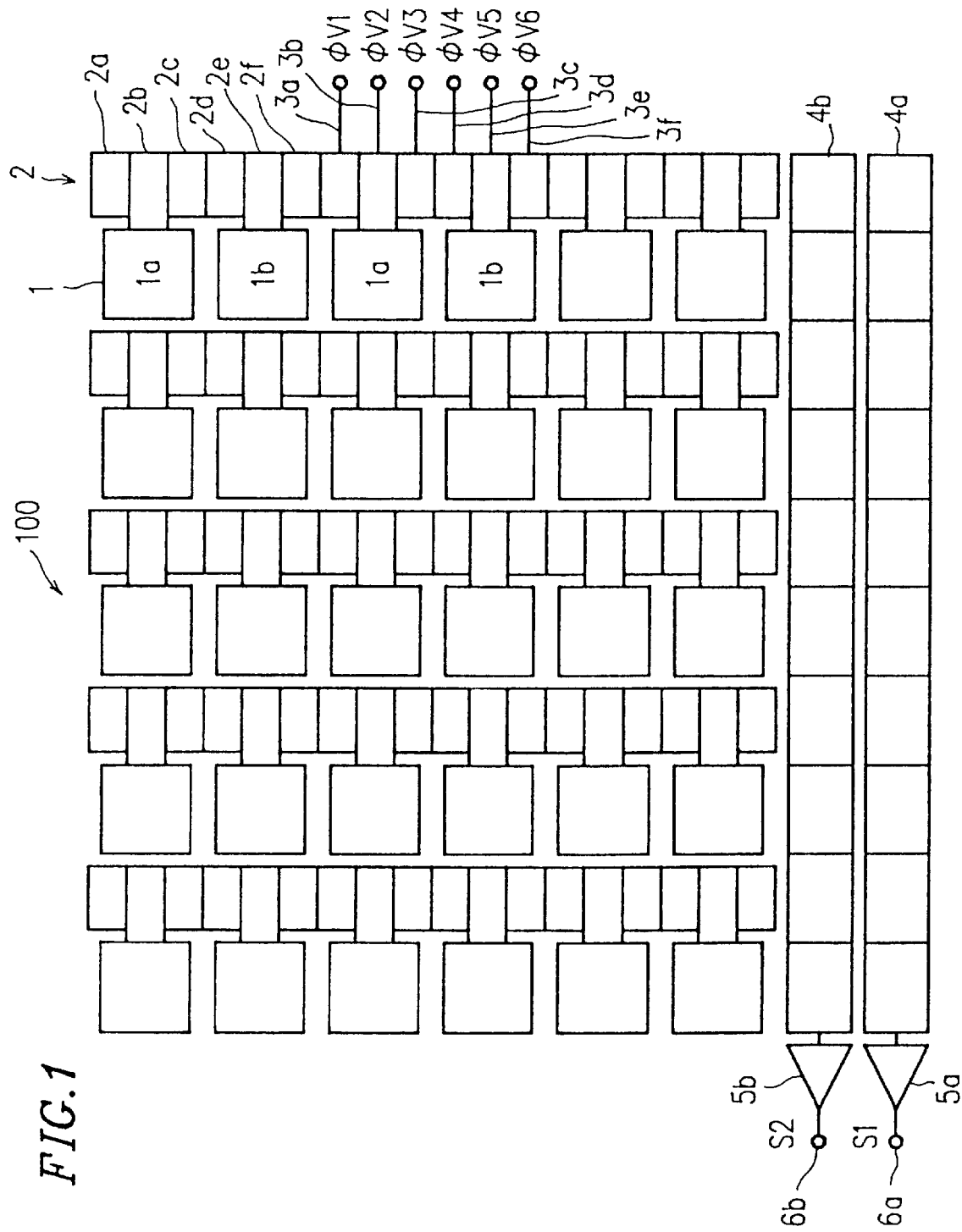
FIG. 1 is a schematic plan view of a solid-state imaging device in a solid-state imaging apparatus in a first example according to the present invention.

FIG. 1 is a schematic plan view illustrating the structure of a solid-state imaging device 100 in the first example. The solid-state imaging device 100 includes a plurality of photoelectric converting sections 1 arranged in a matrix, namely in rows and columns. Each photoelectric converting section 1 acts as a light receiving element and corresponds to one pixel. The solid-state imaging device 100 further includes a plurality of vertical charge transfer sections 2, driving pulse input terminals 3a through 3f, horizontal charge transfer sections 4a and 4b, output amplifiers 5a and 5b, and output terminals 6a and 6b. Each of the plurality of vertical charge transfer sections 2 includes a plurality of transfer gates and a plurality of semiconductor regions below (not shown) the respective transfer gates. The transfer gates in each vertical charge transfer section 2 are arranged in a line. The plurality of vertical charge transfer sections 2 and the plurality of columns of photoelectric converting sections 1 are provided to be adjacent to each other. Two adjacent photoelectric converting sections 1a and 1b in the same column form a pair. The photoelectric converting section 1a is adjacent to three transfer gates 2a, 2b and 2c; and the photoelectric converting section 1b is adjacent to three transfer gates 2d, 2e and 2f. The transfer gates 2a through 2f are connected to the driving pulse input terminals 3a through 3f, respectively. Although not shown in FIG. 1 completely, all the transfer gates are respectively connected to the driving pulse input terminals. For example, the transfer gate 2a is connected to the driving pulse input terminal 3a; and the transfer gate 2b is connected to the driving pulse input terminal 3b. The horizontal charge transfer sections 4a and 4b are located to be substantially perpendicular to the vertical charge transfer sections 2 and adjacent to one end of each vertical transfer section 2. The horizontal charge transfer section 4a is connected to the output amplifier 5a, which is connected to the output terminal 6a. The horizontal charge transfer section 4b is connected to the output amplifier 5b, which is connected to the output terminal 6b.

Figure 2:
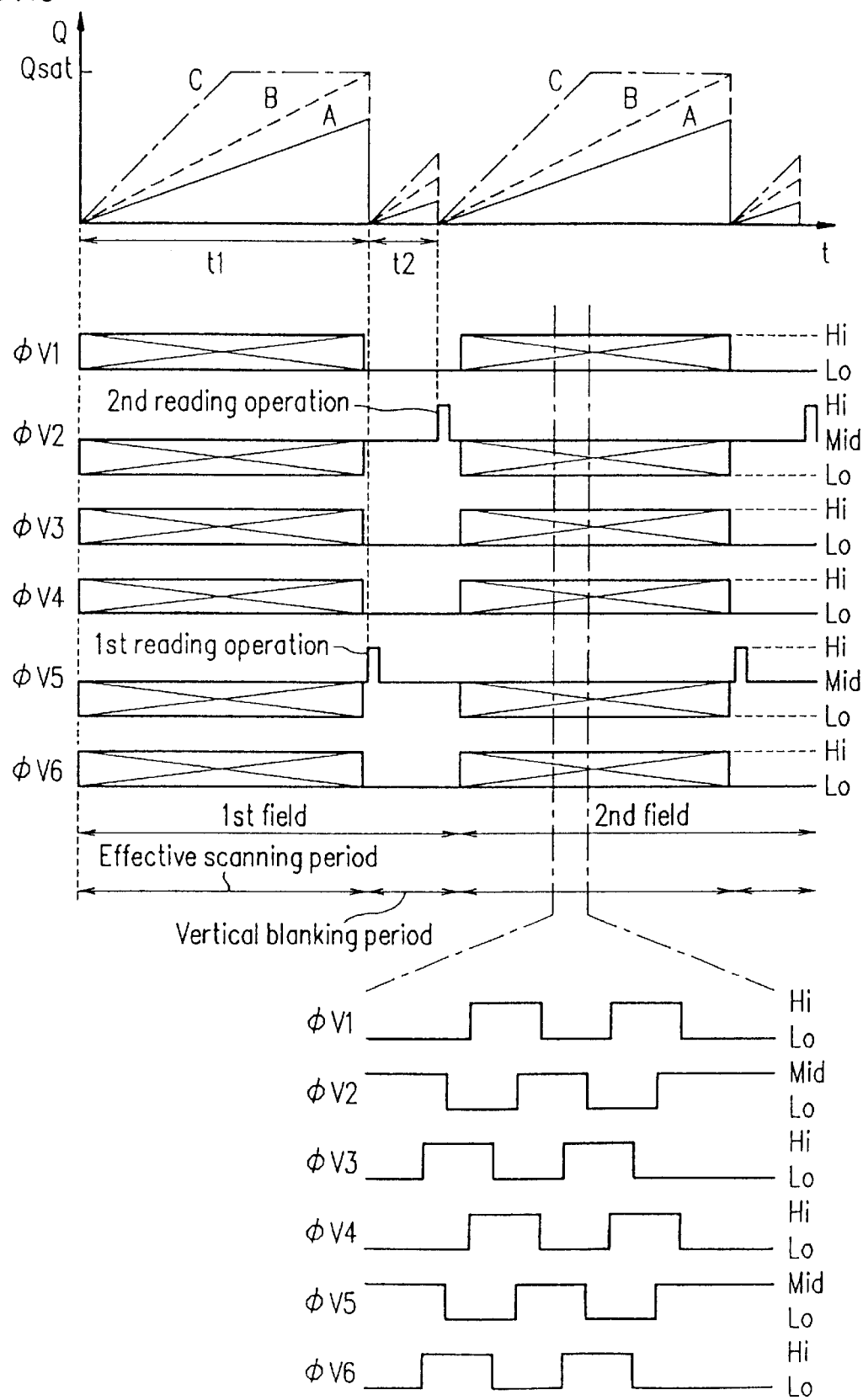
FIG. 2 is a graph illustrating the timing at which pulses are input, and the relationship between such timing and the quantity of charges from photoelectric converting sections in the solid-state imaging device shown in FIG. 1.

FIG. 2 is a timing chart illustrating the operation of the solid-state imaging device 100. $\phi V1$ through $\phi V6$ are respectively pulses which are input to the driving pulse input terminals 3a through 3f. In FIG. 2, each of the rectangular boxes having two diagonal lines therein indicates that a pulse is input to the corresponding driving pulse input terminal repeatedly as is shown in the enlarged section within the period shown by the box. For example, the left box corresponding to $\phi V1$ indicates that a pulse having a "high" voltage is input repeatedly during time duration t1.

The solid-state imaging device 100 operates in the following manner.

In a first field, when light is incident on the solid-state imaging device 100, the light is converted into an electric charge by the photoelectric converting sections 1, and the charge is accumulated therein. In a vertical blanking period of a TV scanning system, a "high" voltage is applied to the driving pulse input terminal 3e. By such voltage application, a charge Q1 accumulated in the photoelectric converting section 1b is read to the semiconductor region below the transfer gate 2e. In this manner, a first reading operation is performed. Immediately after the first reading operation is finished, the charge Q1 in the photoelectric converting section 1b is totally discharged to the substrate of the solid-state imaging device 100, thereby leaving no charge in the photoelectric converting section 1b.

Within the same vertical blanking period, a "high" voltage is applied to the driving pulse input terminal 3b. By such voltage application, a charge Q2 accumulated in the photoelectric converting section 1a is read to the semiconductor region below the transfer gate 2b, independently from the charge Q1. In this manner, a second reading operation is performed.

In a second field, the charge Q1 obtained in the first reading operation and the charge Q2 obtained in the second reading operation are transferred to the horizontal charge transfer sections 4a and 4b, respectively. Then, the charges Q1 and Q2 are transferred through the output amplifiers 5a and 5b and output terminals 6a and 6b as signals S1 and S2.

Figure 18:
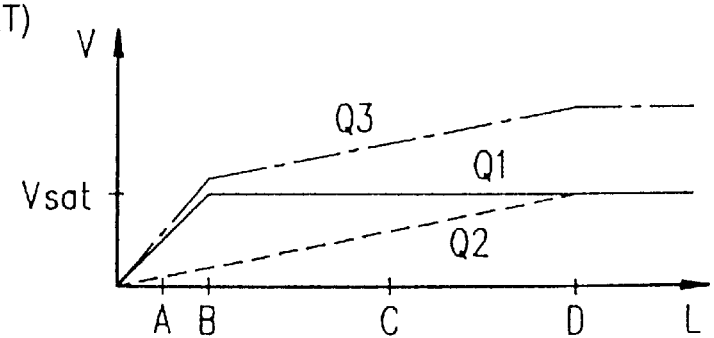
FIG. 18 is a graph illustrating the photoelectric converting characteristics of signals obtained in a conventional solid-state imaging device.

FIG. 2 also shows the relationship between the timing at which the pulses are input and the level of the charges accumulated in the photoelectric converting sections 1. The horizontal axis represents the timing at which the pulses are input, and the vertical axis represents the quantity of the charge. The solid lines indicate such relationship when the intensity of light is A, the dashed lines indicate such relationship when the intensity of light is B, and the chain lines indicate such relationship when the intensity of light is C. The intensities A, B and C are as shown in FIG. 18.

Figure 3:
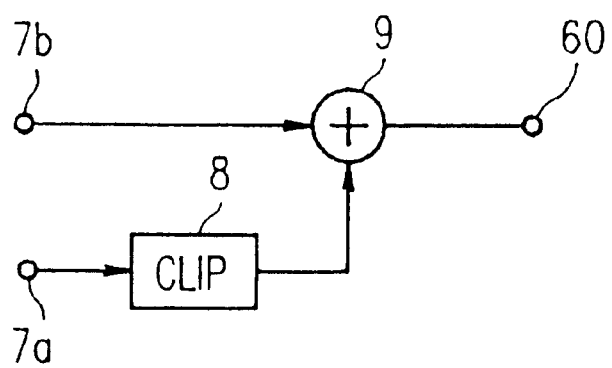
FIG. 3 is a block diagram of a signal processing circuit in the first example.

FIG. 3 is a diagram of a signal processing circuit used in the solid-state imaging device 100. The signal processing circuit includes input terminals 7a and 7b, a clip circuit 8, and an addition circuit 9. The signal processing circuit operates in the following manner.

The signal S1 is input from the output terminal 6a (FIG. 1) to the input terminal 7a and is sent to the clip circuit 8. The clip circuit 8 clips a signal having a voltage exceeding a reference voltage Vth, thereby reducing the level of such a signal to the reference voltage Vth. The reference voltage Vth is set to be slightly lower than saturation levels Vsat which correspond to saturation levels Qsat of the photoelectric converting sections 1. By such an effect of the clip circuit 8, the influence of non-uniformity among the saturation levels Qsat of the photoelectric converting sections 1 on the operation of the solid-state imaging device 100 is substantially eliminated.

The signal S2 is sent from the output terminal 6b to the addition circuit 9 through an input terminal 7b. The signal S1 output from the clip circuit 8 and the signal S2 are mixed by the addition circuit 9, and the resulting signal is output from the output terminal 60 as a signal S3.

Figure 4:
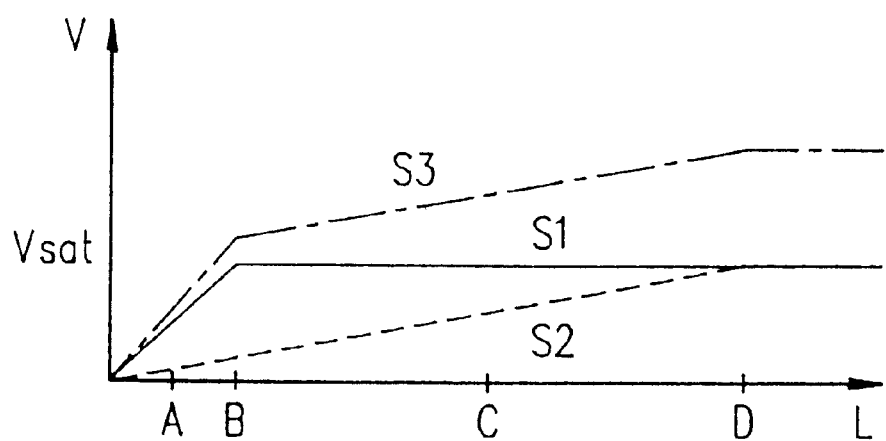
FIG. 4 is a graph illustrating the photoelectric converting characteristics of signals obtained by first and second reading operations performed by the solid-state imaging device shown in FIG. 1.

FIG. 4 is a graph illustrating the photoelectric converting characteristic for the signals S1, S2 and S3. The horizontal axis represents the intensity of light, and the vertical axis represents the voltage of the signals. The solid line indicates such a characteristic of the signal S1, the dashed line indicates such a characteristic of the signal S2, and the chain line indicates such a characteristic of the signal S3.

As is shown in FIG. 4, the voltage of the signal S1 reaches the saturation level of the photoelectric converting section 1 when the intensity of light becomes B. The voltage of the signal S2 reaches the saturation level of the photoelectric converting section 1 when the intensity of light becomes D. The signal S2 provides a wide dynamic range, but provides a low S/N ratio when the intensity of light is relatively low due to the low signal level thereof. The signal S1 provides a narrow dynamic range but provides a high S/N ratio due to the high signal level thereof. The signal S3 obtained as a result of mixture of the signals S1 and S2 provides a high S/N ratio even when the intensity of light is relatively low, and also provides a wide dynamic range.

Where the charge Q1 read by the first reading operation is accumulated for time duration t1 and the charge Q2 read by the second reading operation is accumulated for time duration t2, the dynamic range obtained by the signal S3 with respect to the dynamic range obtained by the signal S1 is t2/t1.

In the solid-state imaging device 100 in the first example, the charges read by the plurality of reading operations are transferred separately, and the levels of the signals exceeding the reference voltage Vth are lowered to the reference voltage Vth, which is set to be slightly lower than the saturation level. In this manner, the influence of the non-uniformity in the saturation levels of the plurality of photoelectric converting sections 1 is substantially eliminated. As a result, a satisfactory image is displayed.

In the above-described example, two reading operation are performed. In an alternative method, three or more reading operations are performed using a different structure for the vertical charge transfer section 2.

EXAMPLE 2

Figure 5:
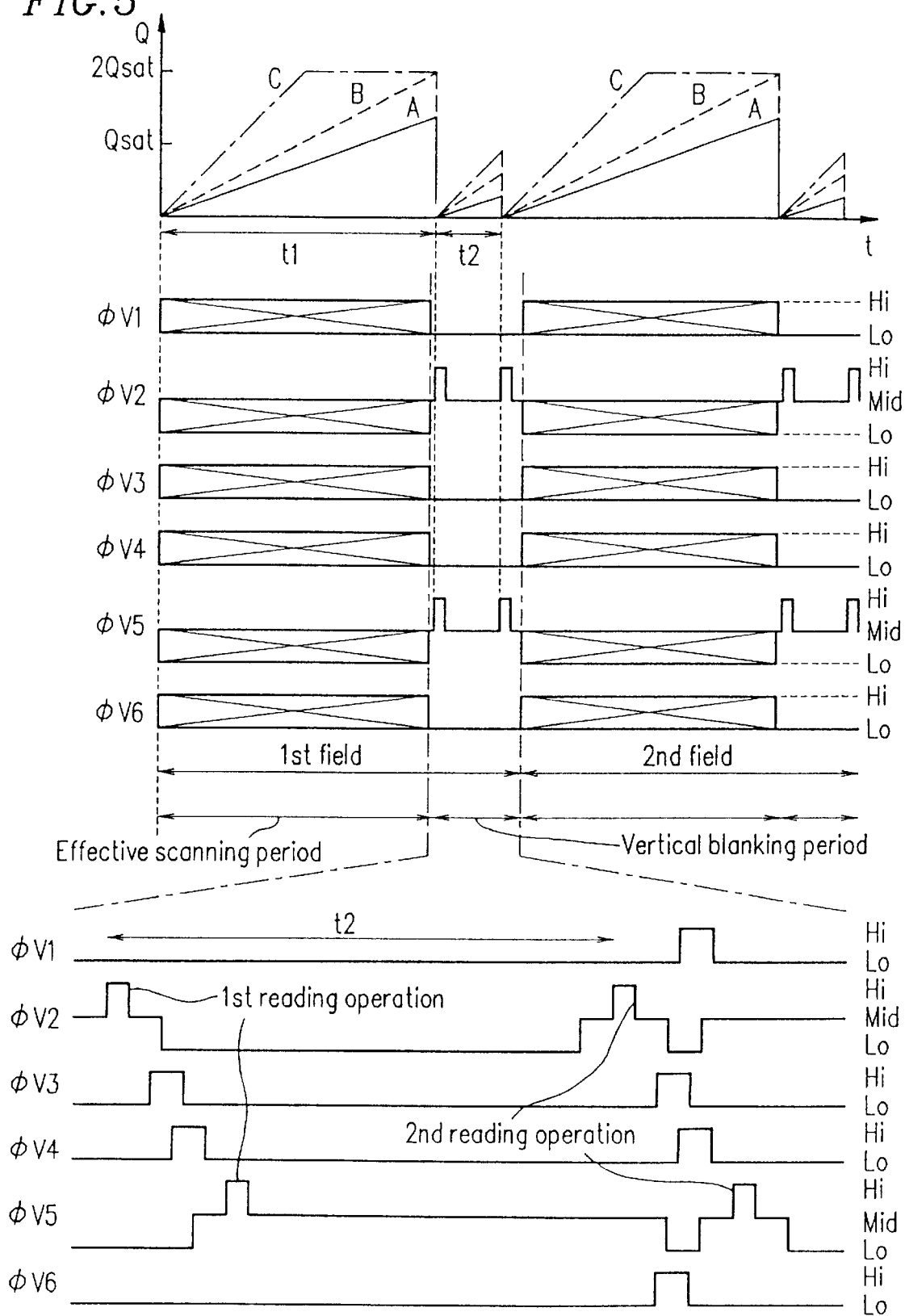
FIG. 5 is a graph illustrating the timing at which pulses are input, and the relationship between such timing and the quantity of charges from photoelectric converting sections in a second example according to the present invention.

In a second example according to the present invention, the solid-state imaging device 100 shown in FIG. 1 operates as is illustrated in FIG. 5. φV1 through φV6 are respectively pulses which are input to the driving pulse input terminals 3a through 3f.

In a first field, when light is incident on the solid-state imaging device 100, the light is converted into an electric charge by the photoelectric converting sections 1, and the charge is accumulated therein. As is shown in the enlarged section in FIG. 5, in a vertical blanking period of a TV scanning system, a "high" voltage is applied to the driving pulse input terminals 3b and 3e. By such voltage application, charges Q1 accumulated in the photoelectric converting sections 1a and 1b are read to the semiconductor regions below the transfer gates 2b and 2e. In this manner, a first reading operation is performed. The charges Q1 from the photoelectric converting sections 1a and 1b which are adjacent to each other in the direction of the column (corresponding to two adjacent pixels) are mixed together.

Within the same vertical blanking period, a "high" voltage is applied to the driving pulse input terminals 3b and 3e. By such voltage application, charges Q2 accumulated in the photoelectric converting sections 1a and 1b are read to the semiconductor regions below the transfer gates 2b and 2e independently from the charges Q1. In this manner, a second reading operation is performed. The charges Q2 from the photoelectric converting sections 1a and 1b which are adjacent to each other in the direction of the column are mixed together.

In a second field, the charges Q1 obtained in the first reading operation and the charges Q2 obtained in the second reading operation are transferred to the horizontal charge transfer sections 4a and 4b, respectively. Then, the charges Q1 and Q2 are transferred through the output amplifiers 5a and 5b and output terminals 6a and 6b as signals S1 and S2.

FIG. 5 shows the relationship between the timing at which the pulses are input and the quantity of the charges accumulated in the photoelectric converting sections 1. The horizontal axis represents the timing at which the pulses are input, and the vertical axis represents the quantity of the charge. The solid lines indicate such relationship when the intensity of light is A, the dashed lines indicate such relationship when the intensity of light is B, and the chain lines indicate such relationship when the intensity of light is C.

The signals S1 and S2 are processed in the same manner by a signal processing circuit having the same structure as in the first example.

The resultant signal S3 provides a wide dynamic range and also provides a high S/N ratio even when the intensity of light is relatively low.

In the second example, the charges from two adjacent photoelectric converting sections are mixed together in the vertical charge transfer section 2. Accordingly, the quantity of the resultant charge is twice as high as the quantity of the charge which is obtained without the mixture for the same intensity of light. As a result, the sensitivity of the solid-state imaging device 100 is improved.

In the above-described example, two reading operations are performed during the vertical blanking period. In order to perform the first reading operation during an effective scanning period before the vertical blanking period, the solid-state imaging device needs to be of a frame inter-line transfer type provided with a charge accumulating section or needs to be provided with an external memory. Performing a plurality of reading operations during the vertical blanking period allows the use of an inter-line transfer solid-state imaging device having a simpler structure with no frame memory.

In the above-described example, two reading operations are performed. In an alternative method, three or more reading operations are performed using a different structure for the vertical charge transfer section 2.

EXAMPLE 3

A solid-state imaging device 300 in a third example according to the present invention will be described with reference to FIGS. 6 and 7.

Figure 6:
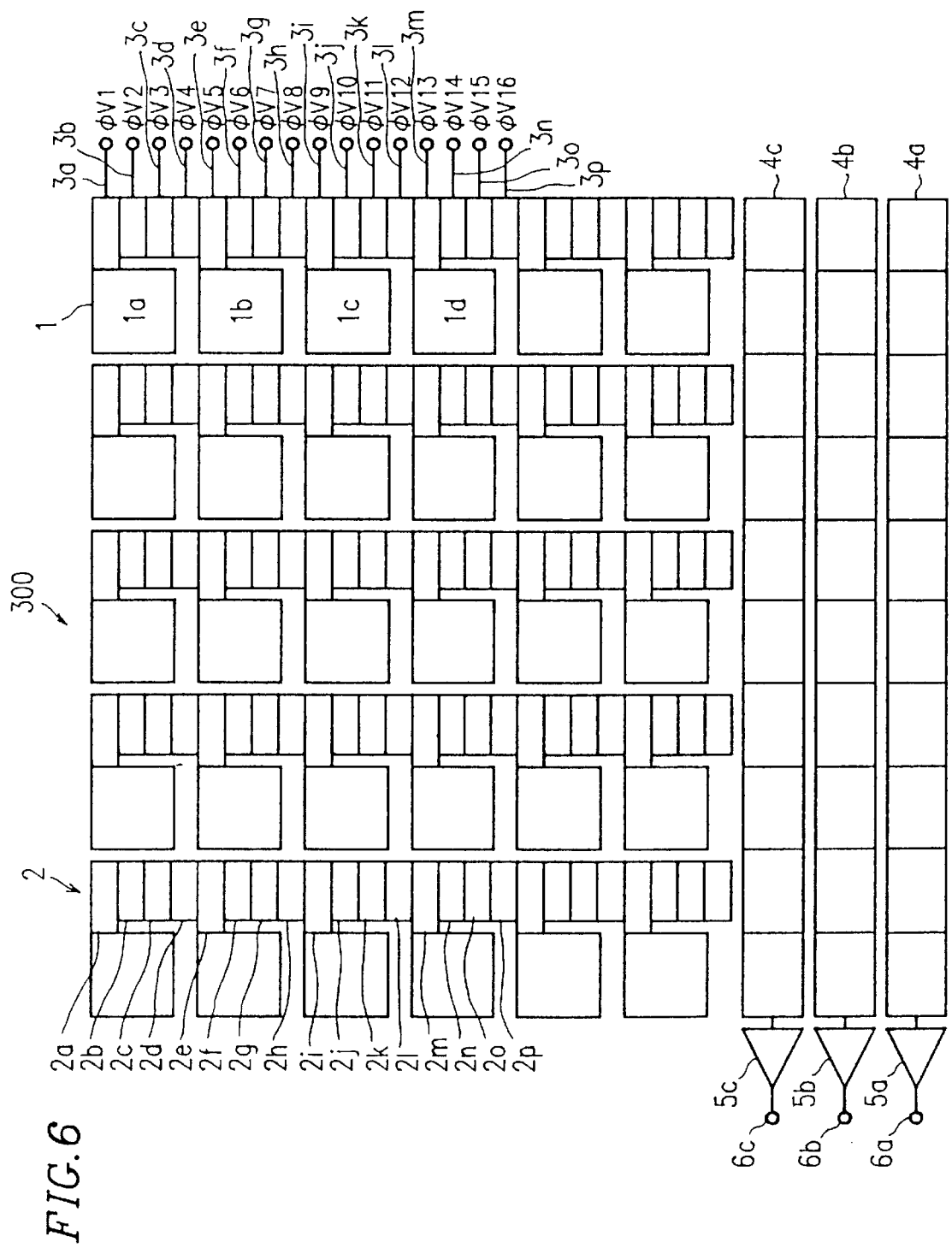
FIG. 6 is a schematic plan view of a solid-state imaging device in a solid-state imaging apparatus in a third example according to the present invention.

FIG. 6 is a schematic partial plan view illustrating a structure of a solid-state imaging device 300 in the third example. The solid-state imaging device 300 includes a plurality of photoelectric converting sections 1 arranged in a matrix, namely in rows and columns. Each photoelectric converting section 1 acts as a light receiving element and corresponds to one pixel. The solid-state imaging device 300 further includes a plurality of vertical charge transfer sections 2, driving pulse input terminals 3a through 3p, horizontal charge transfer sections 4a, 4b and 4c, output amplifiers 5a, 5b and 5c, and output terminals 6a, 6b and 6c. Each of the plurality of vertical charge transfer sections 2 includes a plurality of transfer gates and a plurality of semiconductor regions below (not shown) the respective transfer gates. The transfer gates in each vertical charge transfer section 2 are arranged in a line. The plurality of vertical charge transfer sections 2 and the plurality of columns of photoelectric converting sections 1 are provided to be adjacent to each other. Four successive photoelectric converting sections 1a, 1b, 1c and 1d in the same column form a set. The photoelectric converting section 1a is adjacent to four transfer gates 2a, 2b, 2c and 2d; and the photoelectric converting section 1b is adjacent to four transfer gates 2e, 2f, 2g and 2h. The other photoelectric converting sections are each adjacent to four transfer gates in the same manner. The transfer gates 2a through 2p are connected to the driving pulse input terminals 3a through 3p, respectively. Although not shown in FIG. 6 completely, all the transfer gates are respectively connected to the driving pulse input terminals. The horizontal charge transfer sections 4a through 4c, the output amplifiers 5a through 5c, and the output terminals 6a through 6c are provided in a similar manner as in the first example.

Figure 7:
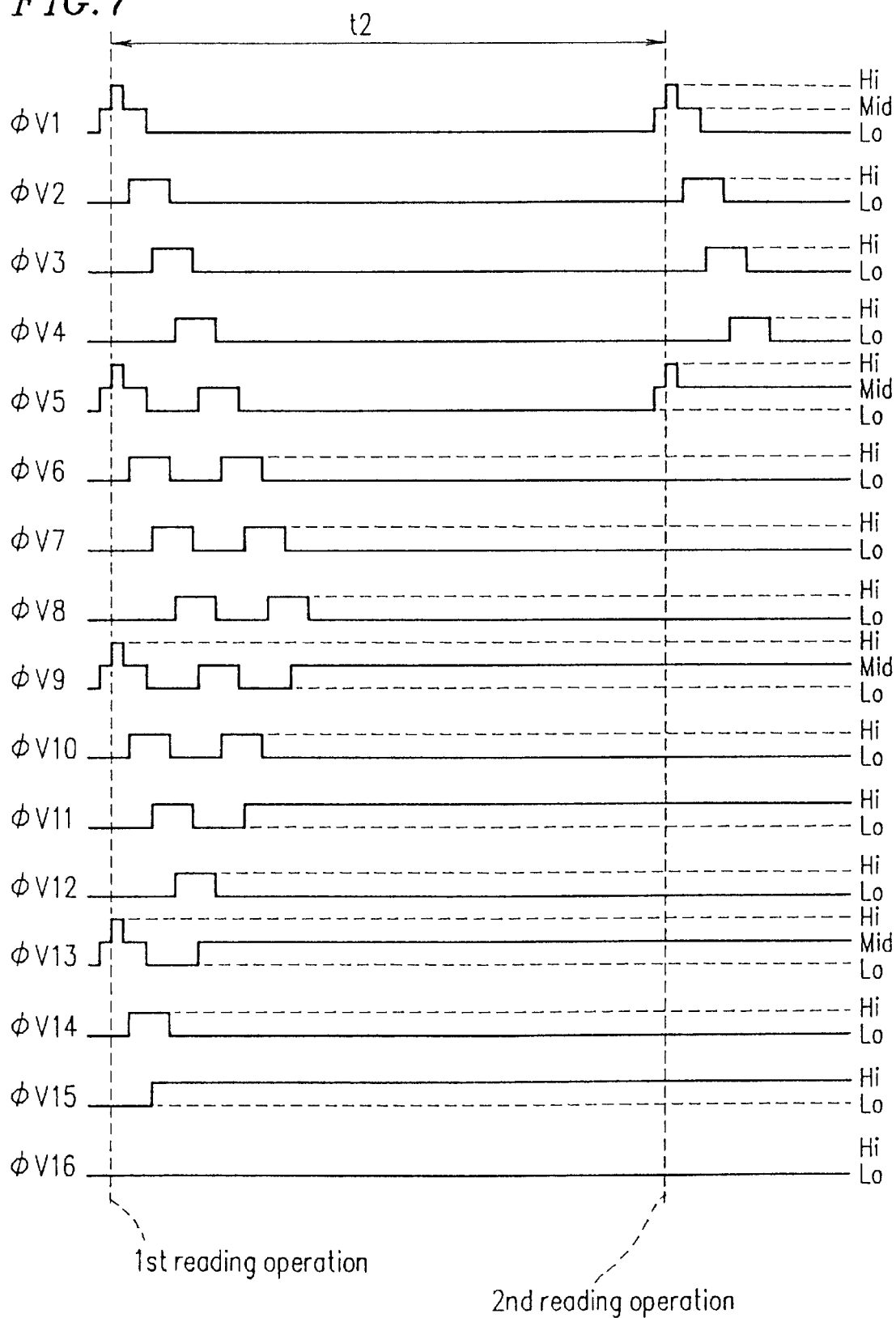
FIG. 7 is a waveform diagram illustrating first and second reading operations performed by the solid-state imaging device shown in FIG. 6.

FIG. 7 is a timing chart illustrating the operation of the solid-state imaging device 300. $\phi$V1 through $\phi$V16 are respectively pulses which are input to the driving pulse input terminals 3a through 3p. In FIG. 7, the chain lines indicate that the pulses are input repeatedly in the same manner.

The solid-state imaging device 300 operates in the following manner.

In a first field, when light is incident on the solid-state imaging device 300, the light is converted into an electric charge by the photoelectric converting sections 1, and the charge is accumulated therein. In a vertical blanking period of a TV scanning system, a "high" voltage is applied to the driving pulse input terminals 3a, 3e, 3i and 3m. By such voltage application, charges Q1 accumulated in the photoelectric converting sections 1a through 1d are read to the semiconductor regions below the transfer gates 2a, 2e, 2i and 2m. In this manner, a first reading operation is performed. The vertical charge transfer sections 2 accumulate the charges independently. In this manner, a first reading operation is performed.

Within the same vertical blanking period, a "high" voltage is applied to the driving pulse input terminals 3a and 3e. By such voltage application, charges Q2 accumulated in the photoelectric converting sections 1a and 1b are read to the semiconductor regions below the transfer gates 2a and 2e independently from the charges Q1. The charges Q2 from the photoelectric converting sections 1a and 1b are mixed together. In this manner, a second reading operation is performed. Immediately after the second reading operation is finished, the charges remaining in the photoelectric converting sections 1 are discharged to the substrate of the solid-state imaging device 300.

In a second field, the charges Q1 obtained in the first reading operation are transferred to the horizontal charge transfer sections 4a and 4b, and the charges Q2 obtained in the second reading operation are transferred to the horizontal charge transfer section 4c. Then, the charges Q1 are transferred through the output amplifiers 5a and 5b and output terminals 6a and 6b as signals S1, and the charges Q2 are transferred through the output amplifier 5c and output terminal 6c as a signal S2.

The signal S1 read by the first reading operation provides a high resolution in the vertical direction because the charges are not mixed to obtain the signal S1. The signal S2 can provide satisfactory tone characteristics of a high luminance area of the image, even though the signal S2 read by the second reading operation provides a low vertical resolution because the signal S2 is obtained as a result of the mixture of the charges.

In the third example, the charges read by at least one of the plurality of reading operations are mixed together in the vertical charge transfer section 2, and the charges read by the other reading operations are transferred with no mixture. In this manner, a wide dynamic range and a high vertical resolution are both realized.

In the above-described example, two reading operations are performed. In an alternative method, three or more reading operations are performed using a different structure for the vertical charge transfer section 2.

EXAMPLE 4

A solid-state imaging device 400 in a fourth example according to the present invention will be described with reference to FIGS. 8 through 10.

Figure 8:
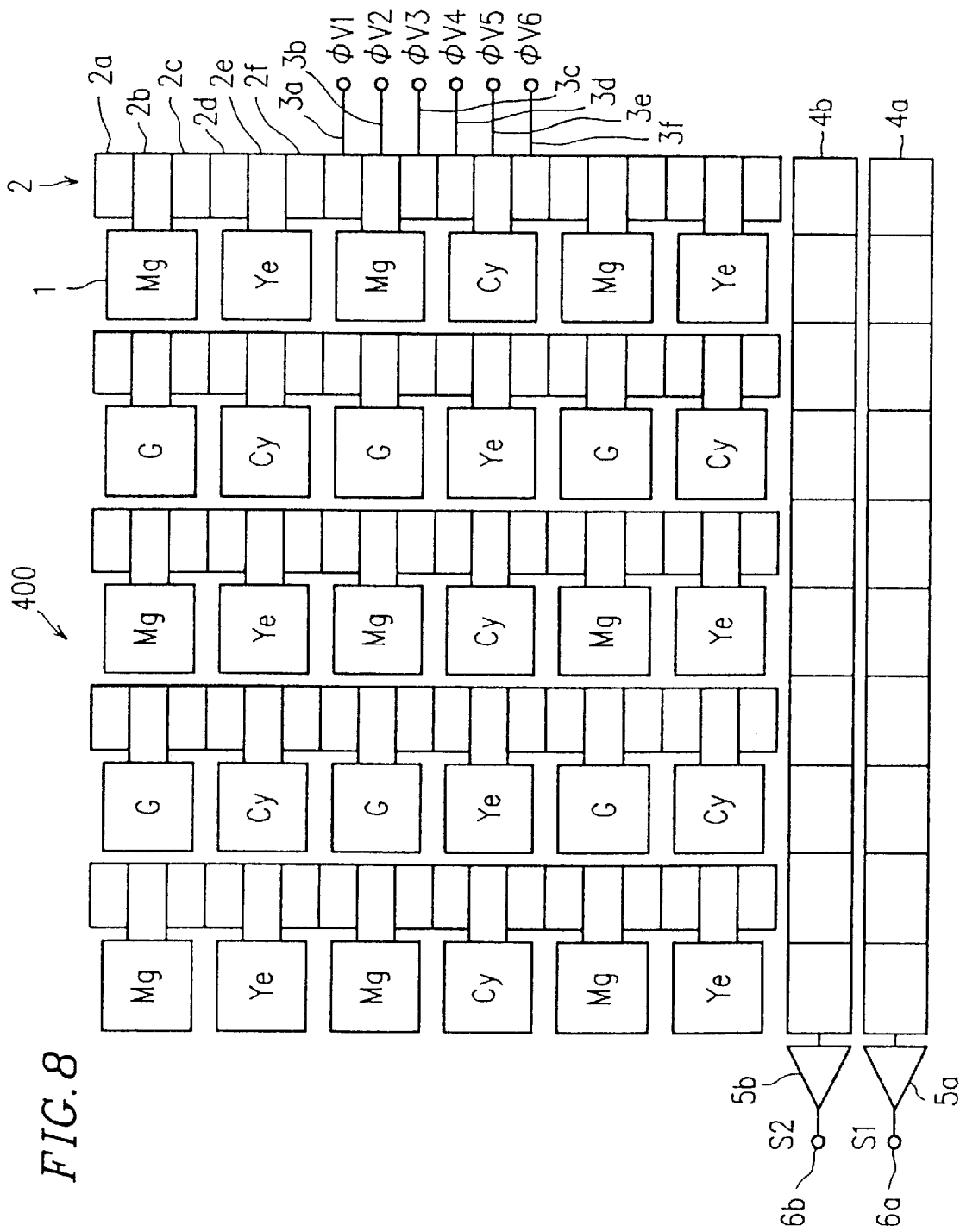
FIG. 8 is a schematic plan view of a solid-state imaging device in a solid-state imaging apparatus in a fourth example according to the present invention.

FIG. 8 is a schematic plan view of the solid-state imaging device 400. The solid-state imaging device 400 has the same structure as that of the solid-state imaging device 100 in the first example except that each photoelectric converting section 1 is provided with of four types of color filters. The four types of color filters have different spectroscopic characteristics to provide colors of magenta (Mg), green (G), yellow (Ye) and cyan (Cy), respectively. The color filters are arranged in the same manner as by a conventional color difference line sequential method reported in the Technical Report of the Institute of Television Engineers, TEBS 87-6, Ed. 694.

The solid-state imaging device 400 operates in the same manner as described in the second example except that the charges to be mixed in the first field and the second field need to be read from different combinations of photoelectric converting sections for interlace.

Figure 9:
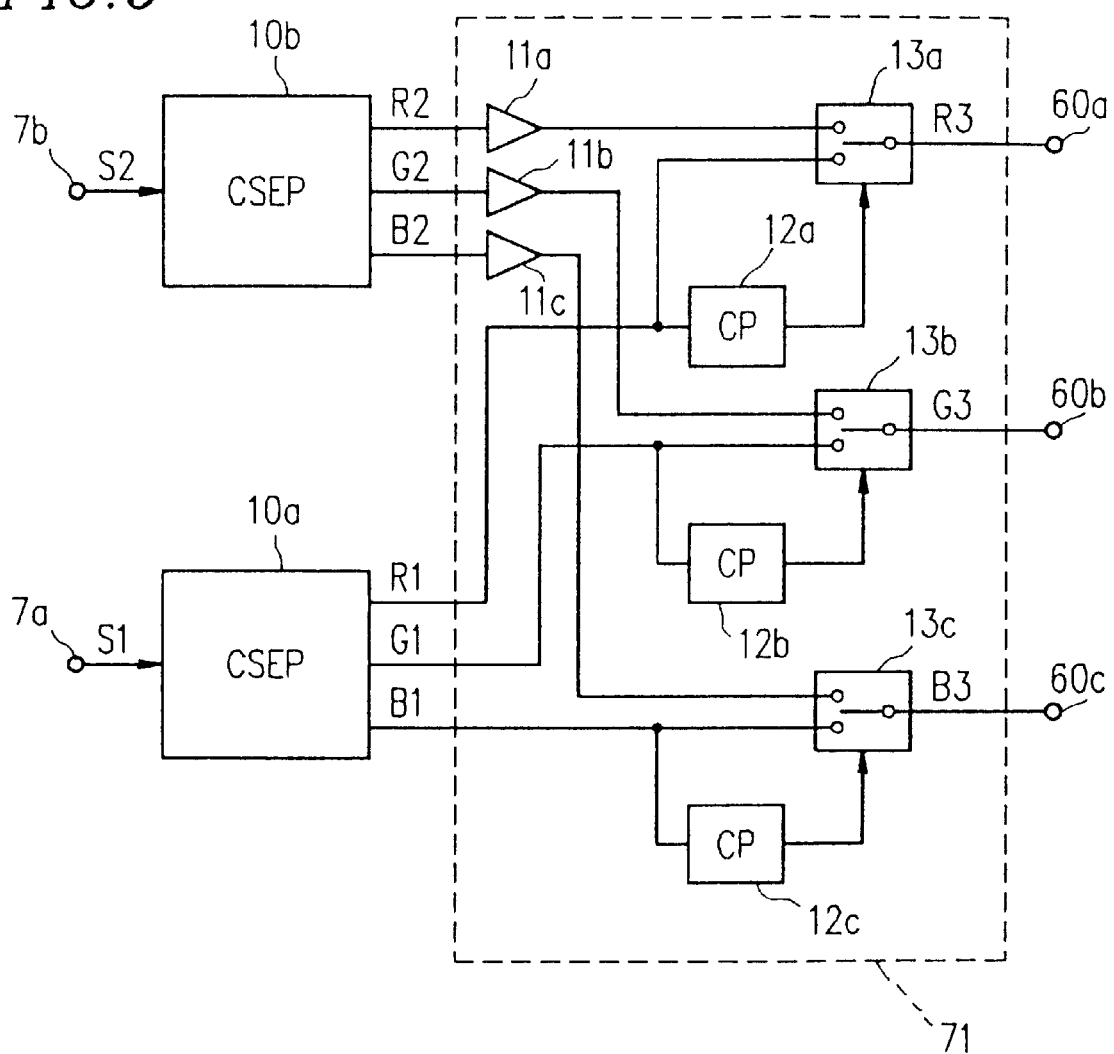
FIG. 9 is a block diagram of a signal processing circuit in the fourth example.

FIG. 9 is a diagram of a signal processing circuit used for the solid-state imaging device 400. The signal processing circuit includes input terminals 7a and 7b, color separation circuits 10a and 10b, amplifiers 11a, 11b, and 11c, comparators 12a, 12b and 12c, multiplexers 13a, 13b and 13c, and output terminals 60a, 60b and 60c. The amplifiers 11a, 11b, and 11c, the comparators 12a, 12b and 12c, and the multiplexers 13a, 13b and 13c are included in a synthesis circuit 71.

The color separation circuits 10a and 10b each receive a signal obtained as a result of mixture of the charges (Mg+Ye, Mg+Cy, G+Ye, or G+Cy) and outputs RGB colors corresponding to the signal received.

The signal processing circuit operates in the following manner.

The signal S1 read by the first reading operation is sent from the output terminal 6a to the input terminal 7a and divided into three signals R1, G2 and B1 by the color separation circuit 10a. The signal S2 read by the second reading operation is sent from the output terminal 6b to the input terminal 7b and divided into three signals R2, G2 and B2 by the color separation circuit 10b. The signals R2, G2 and B2 are amplified by the amplifiers 11a, 11b and 11c, respectively. The resultant signals are sent to the multiplexers 13a, 13b and 13c, respectively. The signals R1, G1 and B1 are also sent to the multiplexers 13a through 13c, respectively. Where the charges Q1 are accumulated in the photoelectric converting sections for time duration t1 and the charges Q2 are accumulated in the photoelectric converting sections for time duration t2, the amplification factor of each of the amplifiers 11a through 11c is t1/t2. The signals R1, G1 and B1 are also sent to the comparators 12a, 12b and 12c and compared with reference signal levels R0, G0 and B0, respectively. Thus, the comparators 12a, 12b and 12c output control signals to the multiplexers 13a through 13c, respectively. In the case when the levels of the signals R1, G1 and B1 are equal to or higher than the reference signal levels R0, G0 and B0, the amplified signals R2, G2 and B2 are selected and output to the output terminals 60a, 60b and 60c as signals R3, G3 and B3 by the multiplexers 13a, 13b, and 13c, respectively. In the case when the levels of the signals R1, G1 and B1 are lower than the reference signal levels R0, G0 and B0, the signals R1, G1 and B1 are selected and output to the output terminals 60a, 60b and 60c as signals R3, G3 and B3.

Figure 10:
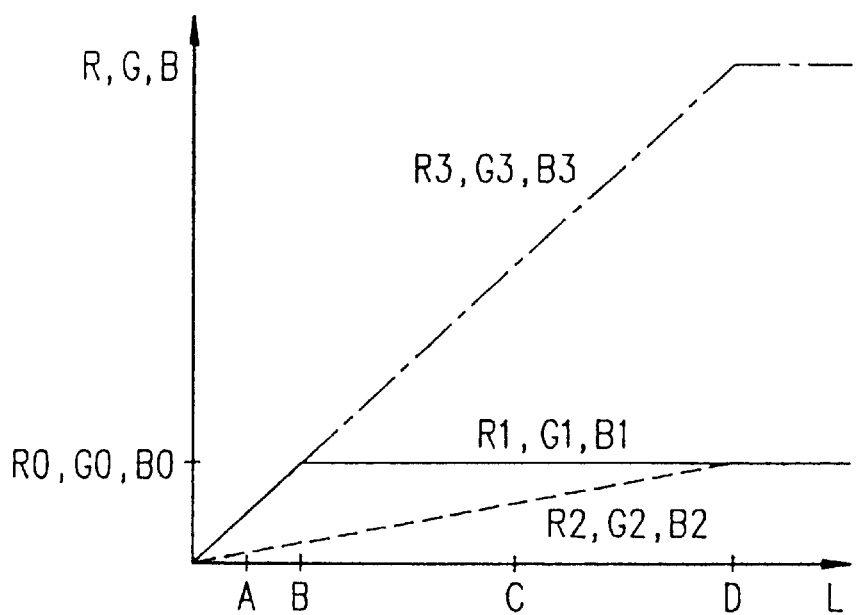
FIG. 10 is a graph illustrating the photoelectric converting characteristics of RGB signals in the fourth example.

FIG. 10 is a graph illustrating the photoelectric converting characteristics of the signals. The horizontal axis represents the intensity of light, and the vertical axis represents the voltage of the signals. The solid line indicates such a characteristic of the signal R1, G1 and B1, the dashed line indicates such a characteristic of the signal R2, G2 and B2, and the chain line indicates such characteristics of the signal R3, G3 and B3. As is appreciated from FIG. 10, the signals R3, G3 and B3 provide a wider dynamic range than the signals R1, G1 and B1.

In the fourth example, the photoelectric converting sections are provided with color filters having different spectroscopic characteristics from one another. A plurality of reading operations are performed during a time duration in which images for one image plane are formed, and the charges read by the reading operations are transferred to the vertical charge transfer section separately. The signals based on the respective charges are divided into three signals for the RGB colors and synthesized by the synthesis circuit. As a result, a color image having a wide dynamic range can be displayed by the single solid-state imaging device 400.

In the above-described example, two reading operations are performed. In an alternative method, three or more reading operations are performed using a different structure for the vertical charge transfer section 2.

EXAMPLE 5

Figure 11:
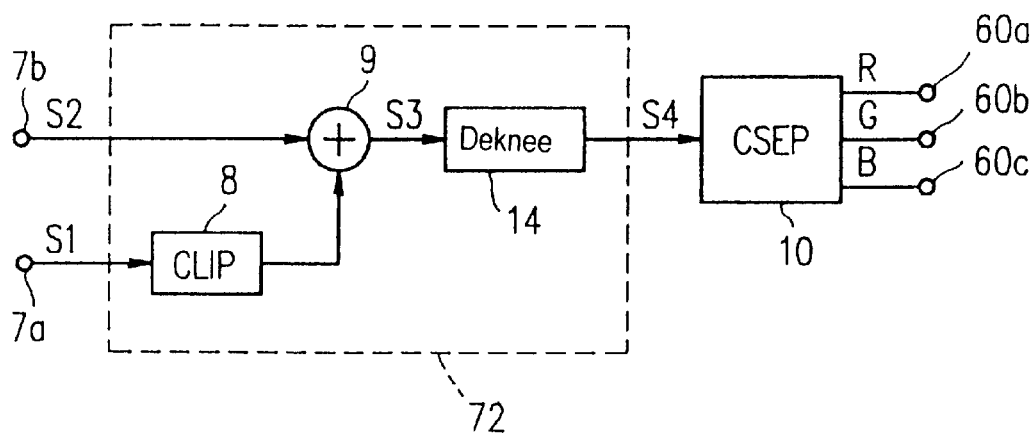
FIG. 11 is a block diagram of a signal processing circuit in a fifth example.

In a fifth example according to the present invention, the solid-state imaging device 400 is provided with a signal processing circuit shown in FIG. 11.

FIG. 11 is a block diagram of the signal processing circuit in the fifth example. The signal processing circuit includes input terminals 7a and 7b, a clip circuit 8, an addition circuit 9, a color separation circuit 10, a deknee circuit 14, and output terminals 60a, 60b and 60c. The clip circuit 8, the addition circuit 9, and the deknee circuit 14 are included in a synthesis circuit 72.

Figure 12:
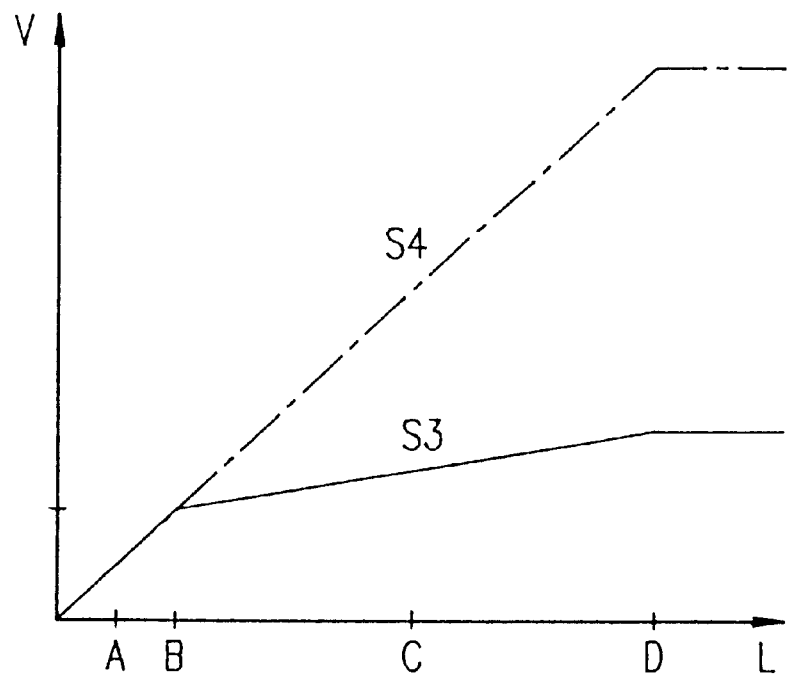
FIG. 12 is a graph illustrating the photoelectric converting characteristics of signals before and after being sent to a deknee circuit.

The signal S1 read by the first reading operation is sent to input terminal 7a and further to the clip circuit 8. A signal having a voltage equal to or higher than a reference voltage Vth is clipped by the clip circuit 8, thereby reducing the level of such a signal to the reference voltage Vth. The reference voltage Vth is set to be a carrier saturation level Vsat at which color separation is possible. The signal S2 read by the second reading operation is sent to the input terminal 7b and further to the addition circuit 9. The signal from the clip circuit 8 is also sent to the addition circuit 9 and mixed with the signal S2. The resultant signal is sent to the deknee circuit 14 as a signal S3. The deknee circuit 14 provides the signal S3 with linear photoelectrics converting characteristics as is shown in FIG. 12, and the resulting signal is output to the color separation circuit 10 as a signal S4.

The deknee circuit 14 is one example of a tone compensation circuit for compensating for a tone characteristics of a signal and has, for example, a similar structure as that of a gamma compensation circuit used in a video camera. For digital signal processing, a ROM table, for example, is used.

The signal S4 is divided into signals R, G and B by the color separation circuit 10, and the signals R, G and B are output from the output terminals 60a through 60c.

In the fifth example, the signals based on the charges separately read by the plurality of reading operations performed by the solid-state imaging device provided with color filters having different spectroscopic characteristics are mixed, and the color separation of the resultant signal is then performed. Accordingly, the signal processing circuit requires only a single color separation circuit.

In the above-described example, two reading operations are performed. In an alternative method, three or more reading operations are performed using a different structure for the vertical charge transfer section 2.

EXAMPLE 6

Figure 13:
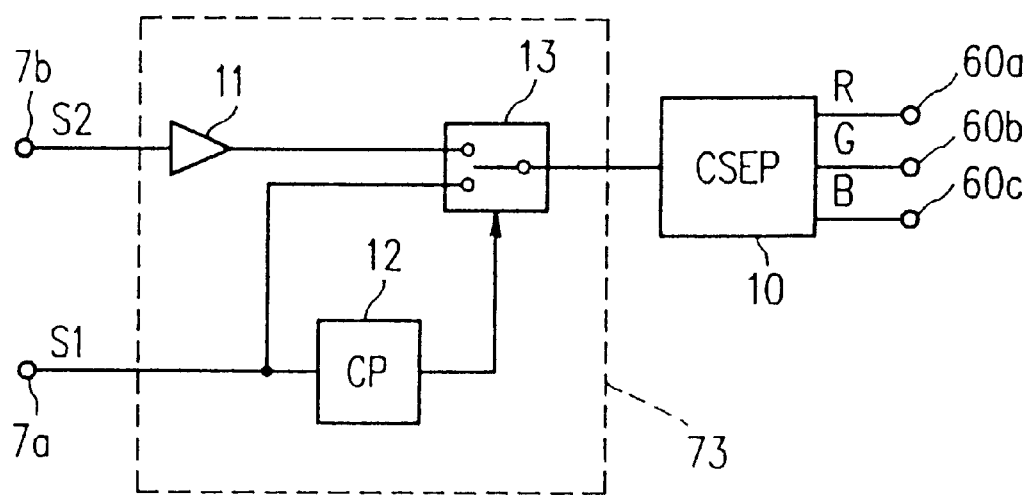
FIG. 13 is a block diagram of a signal processing circuit in the sixth example.

In a sixth example according to the present invention, the solid-state imaging device 400 is provided with a signal processing circuit shown in FIG. 13.

FIG. 13 is a block diagram of the signal processing circuit in the sixth example. The signal processing circuit includes input terminals 7a and 7b, a color separation circuit 10, an amplifier 11, a comparator 12, a multiplexer 13, and output terminals 60a through 60c. The amplifier 11, the comparator 12, and the multiplexer 13 are included in a synthesis circuit 73.

The signal S2 obtained by the second reading operation of the solid-state imaging device 400 is sent to input terminal 7b, is amplified by the amplifier 11, and is sent to the multiplexer 13. The signal S1 obtained by the first reading operation of the solid-state imaging device 400 is sent to the input terminal 7a and further to the multiplexer 13. Where the charges Q1 are accumulated in the photoelectric converting sections for time duration t1 and the charges Q2 are accumulated in the photoelectric converting sections for time duration t2, the amplification factor of the amplifier 11 is t1/t2. The signal S1 is also sent to the comparator 12 and compared with a reference signal level S0. Thus, a control signal is output from the comparator 12 to the multiplexer 13. In the case when the level of the signal S1 is equal to or higher than the reference level S0, the amplified signal S2 is selected. In the case when the level of the signal S1 is lower than the reference level S0, the signal S1 is selected. The selected signal is input to the color separation circuit 10 as a signal S3, and divided into signals R, G, B. The signals R, G, B are output to the output terminals 60a through 60c.

In the sixth example, one of the signals based on the charges separately read by the plurality of reading operations performed by the solid-state imaging device provided with color filters having different spectroscopic characteristics are amplified at a prescribed amplification factor and mixed with the other signals which is not amplified. Then, color separation of the resultant signal is performed. Accordingly, the signal processing circuit requires only a single color separation circuit.

In the above-described example, two reading operations are performed. In an alternative method, three or more reading operations are performed using a different structure for the vertical charge transfer section 2.

EXAMPLE 7

Figure 14:
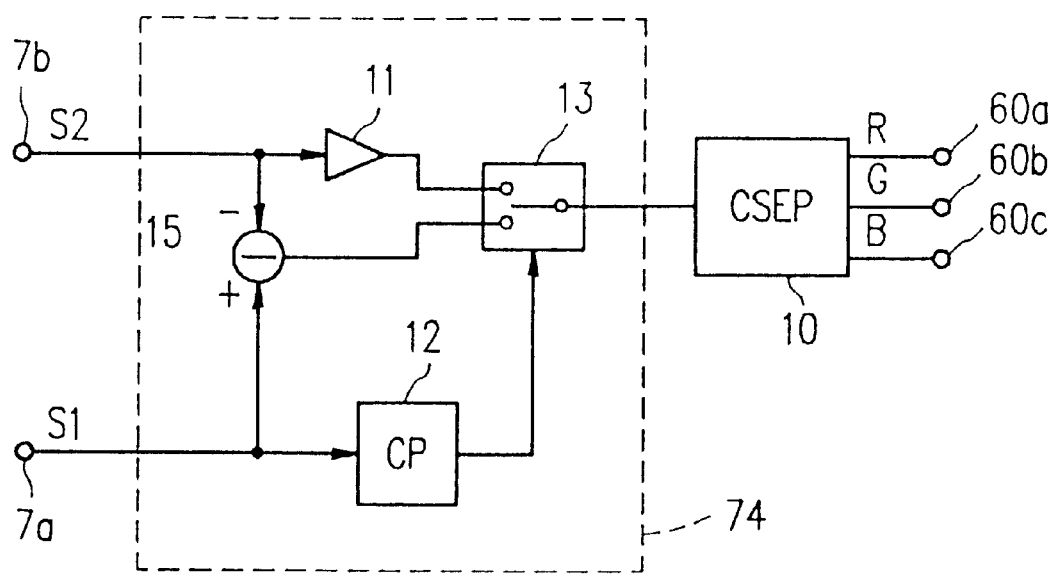
FIG. 14 is a block diagram of a signal processing circuit in a seventh example.

In a seventh example according to the present invention, the solid-state imaging device 400 is provided with a signal processing circuit shown in FIG. 14.

FIG. 14 is a block diagram of the signal processing circuit in the seventh example. The signal processing circuit includes input terminals 7a and 7b, a color separation circuit 10, an amplifier 11, a comparator 12, a multiplexer 13, a subtraction circuit 15, and output terminals 60a through 60c. The amplifier 11, the comparator 12, the multiplexer 13, and the subtraction circuit 15 are included in a synthesis circuit 74.

The signal S2 obtained by the second reading operation of the solid-state imaging device 400 is sent to input terminal 7b and further sent to the subtraction circuit 15. The signal S1 obtained by the first reading operation of the solid-state imaging device 400 is sent to the input terminal 7a. The subtraction circuit 15 subtracts the signal S2 from the signal S1 and outputs the resultant signal to the multiplexer 13. The signal S2 is also amplified by the amplifier 11 without subtraction and sent to the multiplexer 13. Where the charges Q1 are accumulated in the photoelectric converting sections for time duration ti and the charges Q2 are accumulated in the photoelectric converting sections for time duration t2, the amplification factor of the amplifier 11 is (t1−t2)/t2. The signal S1 is also sent to the comparator 12 and compared with a reference signal level S0. Thus, a control signal is output from the comparator 12 to the multiplexer 13. In the case when the level of the signal S1 is equal to or higher than the reference level S0, the signal from the amplifier 11 is selected. In the case when the level of the signal S1 is lower than the reference level S0, the signal from the subtraction circuit 15 is selected. The selected signal is input to the color separation circuit 10 as a signal S3, and divided into signals R, G, B. The signals R, G, B are output to the output terminals 60a through 60c.

Figure 15:
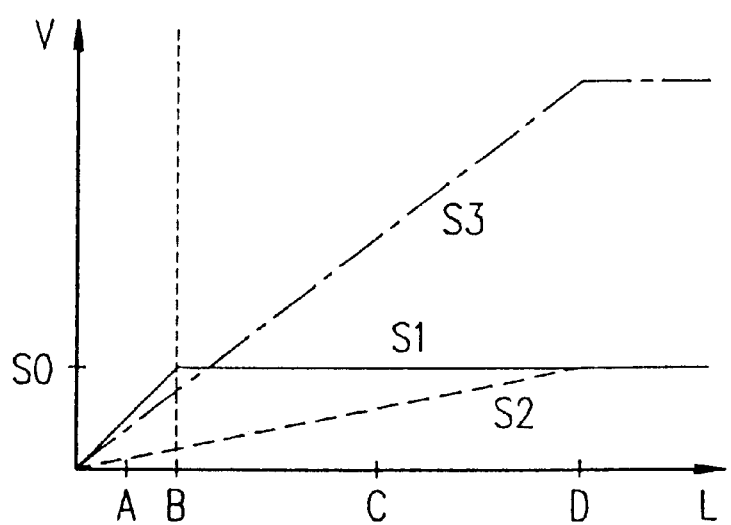
FIG. 15 is a graph illustrating the photoelectric converting characteristics of signals obtained in the seventh example.

FIG. 15 is a graph illustrating the photoelectric converting characteristic of the signals S1, S2 and S3. As is appreciated from FIG. 15, the signal S3 has a much wider dynamic range than the signal S1 or S2.

Generally in an inter-line solid-state imaging device, white lines appear in a vertical direction on a picture (referred to as "smear") by the influence of light leaking to the vertical charge transfer section. The quantity of the charge causing smear is constant with respect to the pixels arranged in a vertical line regardless of the time duration during which the charges are accumulated. In the seventh example, the signals based on the charges separately read by the plurality of reading operations are treated with subtraction. Therefore, the charge causing smear is canceled and a signal which does not generate smear is obtained.

In the above-described example, two reading operations are performed. In an alternative method, three or more reading operations are performed using a different structure for the vertical charge transfer section 2.

EXAMPLE 8

A solid-state imaging device 800 in an eighth example according to the present invention will be described with reference to FIGS. 16 and 17.

Figure 16:
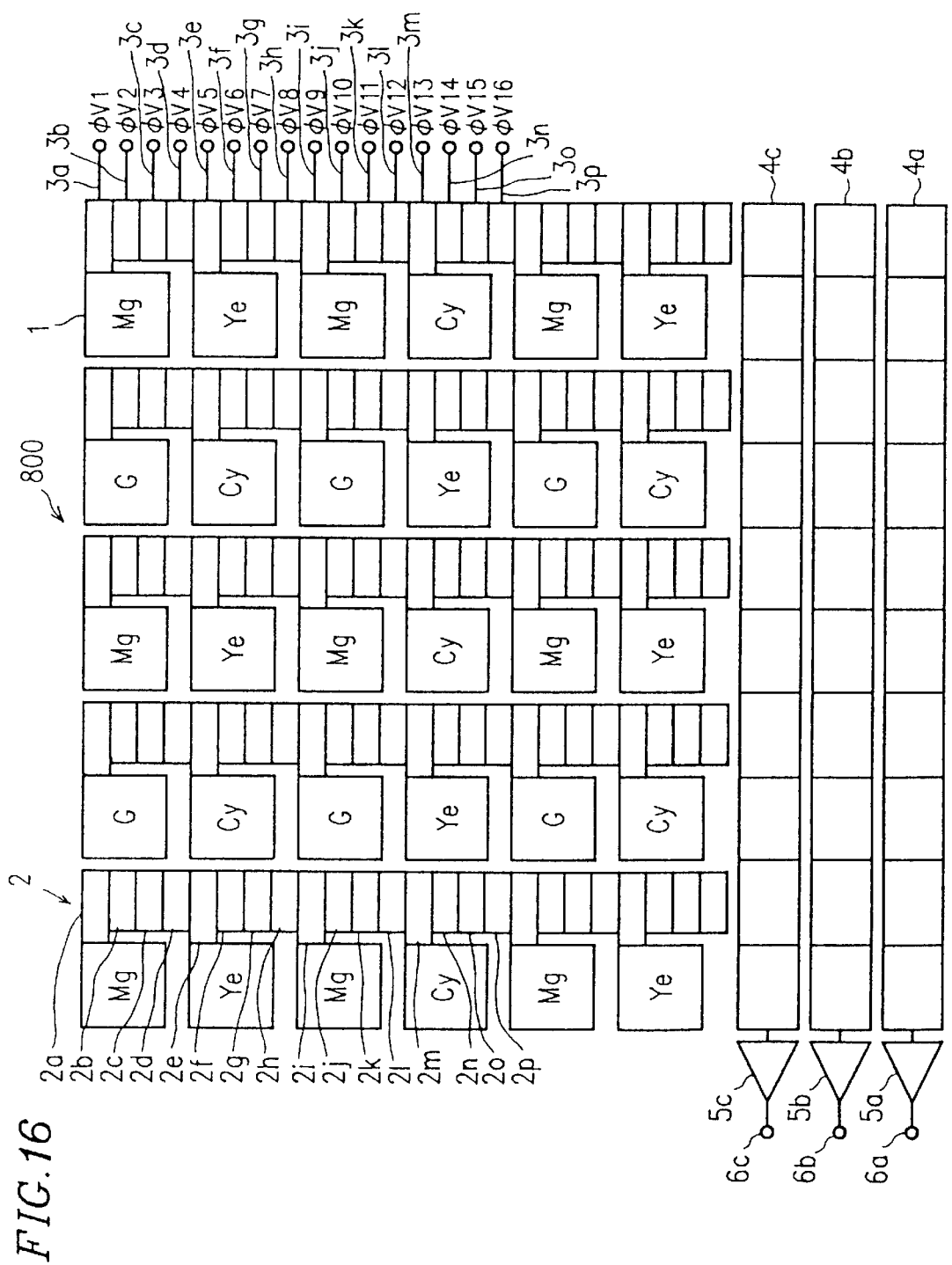
FIG. 16 is a schematic plan view of a solid-state imaging device of a solid-state imaging apparatus in an eighth example according to the present invention.

FIG. 16 is a schematic plan view of the solid-state imaging device 800. The solid-state imaging device 800 has the same structure as that of the solid-state imaging device 300 in the third example except that each photoelectric converting section 1 is provided with one of four types of color filters. The four types of color filters have different spectroscopic characteristics to provide colors of magenta (Mg), green (G), yellow (Ye) and cyan (Cy), respectively. The color filters are arranged in the same manner as explained in Example 4.

The solid-state imaging device 800 operates in the same manner as described in the third example except that the charges to be mixed in the first field and the second field need to be read from different combinations of photoelectric converting sections for interlace.

Figure 17:
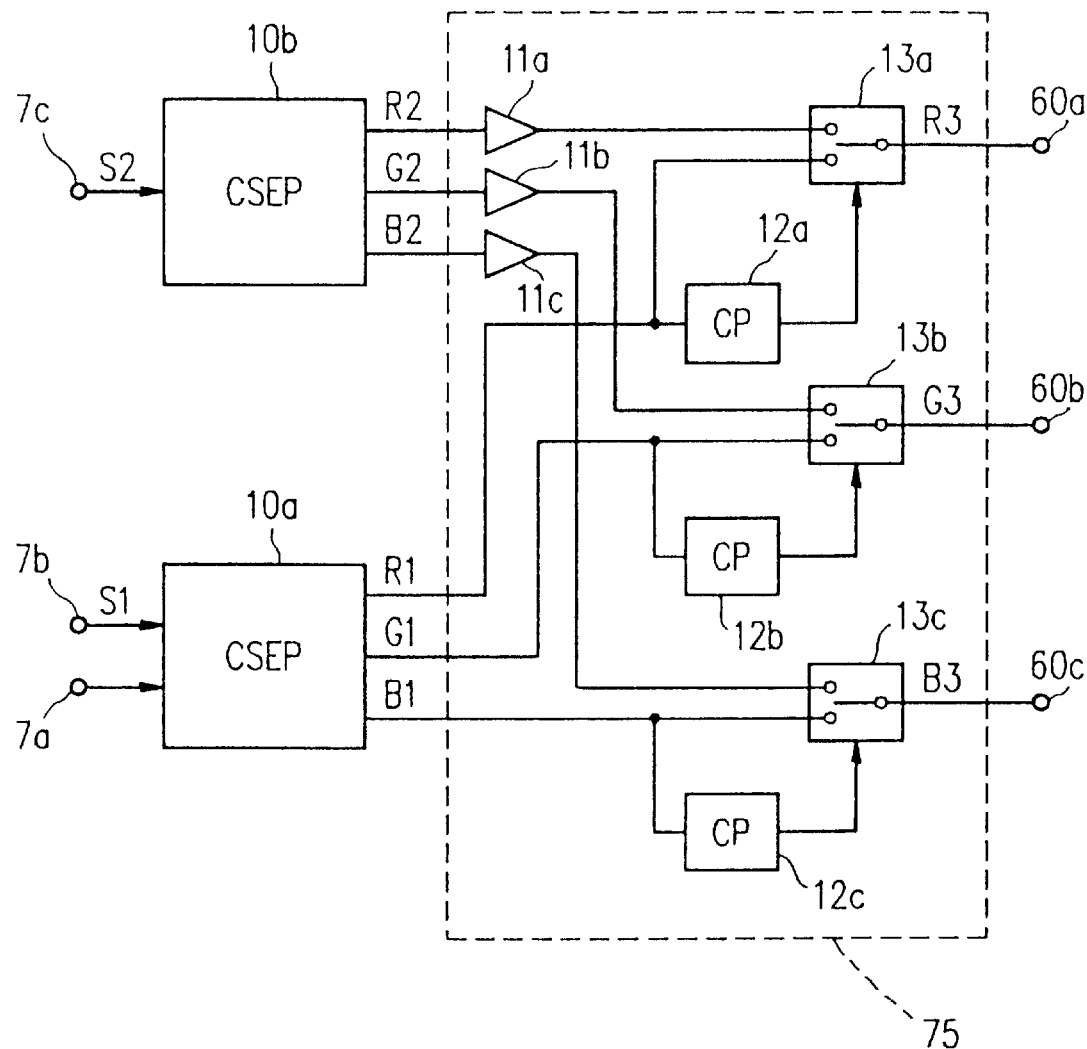
FIG. 17 is a block diagram of a signal processing circuit in the eighth example.

FIG. 17 is a diagram of a signal processing circuit for the solid-state imaging device 800. The signal processing circuit includes input terminals 7a, 7b and 7c, color separation circuits 10a and 10b, amplifiers 11a, 11b, and 11c, comparators 12a, 12b and 12c, multiplexers 13a, 13b and 13c, and output terminals 60a, 60b and 60c. The amplifiers 11a, 11b, and 11c, the comparators 12a, 12b and 12c, and the multiplexers 13a, 13b and 13c are included in a synthesis circuit 75.

The color separation circuit 10b receives a signal obtained as a result of the mixture of the charges (Mg+Ye, Mg+Cy, G+Ye, or G+Cy) and outputs signals R2, G2 and B2. The color separation circuit 10a receives a signal obtained without mixture of the charges (Mg, G, Cy and Ye) and outputs signals R1, G1 and B1.

The signal processing circuit operates in the following manner.

The signal S1 obtained by the first reading operation is sent to the input terminals 7a and 7b and divided into three signals R1, G1 and B1 by the color separation circuit 10a. The signal S2 obtained by the second reading operation is sent to the input terminal 7c and divided into three signals R2, G2 and B2 by the color separation circuit 10b. The signals R1, G1, B1, R2, G2 and B2 are processed in the same manner as in the fourth example.

The signal S1 which is input to the color separation circuit 10a provides a high vertical resolution because no mixture of charges is performed to obtain the signal S1. Accordingly, a signal providing a high vertical resolution is obtained.

In the eighth example, the photoelectric converting sections are provided with color filters having different spectroscopic characteristics from one another. The charges read by at least one of the plurality of reading operations are mixed in the vertical charge transfer section 2, and the other charges are transferred with no mixture. As a result, a color image having a wide dynamic range can be displayed by the single solid-state imaging device 800.

In the above-described example, two reading operations are performed. In an alternative method, three or more reading operations are performed using a different structure for the vertical charge transfer section 2.

As has been described so far, according to the present invention, the charges read by a plurality of reading operations from a plurality of photoelectric converting sections are transferred separately by the solid-state imaging device as signals. Signals having a level exceeding a saturation level are clipped to reduce the levels of such signals substantially to the saturation level. In this manner, the influence of the non-uniformity in the saturation levels among the photoelectric converting sections is substantially eliminated. As a result, satisfactory image quality is obtained.

In the case when the charges from two adjacent photoelectric converting sections are mixed in the vertical charge transfer section, the level of the resultant charge is twice as high as the level of the charge which is obtained without such mixture with respect to the same intensity of light. Accordingly, the sensitivity of the solid-state imaging device is improved.

Since the plurality of reading operations are performed within a vertical blanking period, the solid-state imaging device requires no frame memory and thus the structure thereof is simplified.

In the case when the charges from two adjacent photoelectric converting sections in at least one of the plurality of reading operations are mixed in the vertical charge transfer section and the remaining charges are transferred without such mixture, a wider dynamic range and a higher vertical resolution are obtained.

By providing the photoelectric converting sections with color filters having different spectroscopic characteristics from one another, a color image can be displayed.

In the case when the signals obtained by the solid-state imaging device are divided into RGB color signals by a color separation circuit and then synthesized, a color image having a wider dynamic range can be obtained by a single solid-state imaging apparatus.

In the case when the signals obtained by the solid-state imaging device are synthesized and then divided into RGB color signals, only one color separation circuit is required, thus simplifying the structure of the signal processing circuit.

In the case when a part of the signals obtained by the solid-state imaging device are treated with subtraction and another part of the signals are amplified at a constant amplification factor, and the signal obtained as a result of the subtraction or the signal obtained as a result of the amplification is selected, smear is substantially eliminated from the resultant image.

In the case when the charges from two adjacent photoelectric converting sections in at least one of the plurality of reading operations are mixed in the vertical charge transfer section and the remaining charges are transferred without such mixture, in the state where the photoelectric converting sections are provided with color filters having different spectroscopic characteristics, a color image having a wider dynamic range and a higher vertical resolution can be obtained by a single solid-state imaging apparatus.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method of driving an imaging device including a plurality of photoelectric converting sections and a charge transfer unit including a plurality of vertical charge transfer sections configured to transfer a plurality of charges read from each of the photoelectric converting sections to a plurality of receiving elements, the method comprising the steps of:

performing a first reading operation for providing a first charge accumulated in at least one photoelectric converting section to one of the vertical charge transfer sections;

performing a second reading operation for providing a second charge accumulated in at least one photoelectric converting section to another of the charge transfer sections, wherein the first and second charges remain within the respective vertical charge transfer sections at the same time, and transferring the first charge provided by the first reading operation and second charge provided by the second reading operation from the charge transfer sections to the receiving elements substantially simultaneously without transferring the first and second charges between the first reading operation and the second reading operation, wherein the first charge is transferred separately from the second charge to the receiving elements.

2. A method of driving an imaging device according to claim 1, wherein charges from fewer than all of the photoelectric converting sections are transferred to the charge transfer section in at least one of the reading operations.

3. A method of driving an imaging device according to claim 1, wherein charges from all of the photoelectric converting sections are transferred to the charge transfer section in each of the reading operations.

4. A method of driving an imaging device according to claim 1, wherein the steps of performing the first read operation and performing the second read operation are each performed on both a second photoelectric converting section and a third photoelectric converting section, wherein the second and third photoelectric converting sections are adjacent, further comprising the step of mixing together the first and second charges from the adjacent second and third photoelectric converting sections in the charge transfer section.

5. A method of driving an imaging device according to claim 1, further comprising the steps of:

performing a third read operation on the at least one photoelectric converting section, wherein a third charge accumulated in the at least one photoelectric converting section is provided to the charge transfer section;

performing a fourth read operation on the least one photoelectric converting section, wherein a fourth charge accumulated in the at least one photoelectric converting section is provided to the charge transfer section;

combining the third and fourth charges; and transferring the combined third and fourth charges from the charge transfer section to the receiving element.

6. A method of driving an imaging device according to claim 1, wherein the photoelectric converting sections are provided with color filters different spectroscopic characteristics from one another.

7. A method of driving an imaging device according to claim 1, wherein an image for one image plane is scanned within one field on a television scanning system.

8. A method of driving an imaging device according to claim 1, wherein the imaging device is irradiated by light for different time durations for the plurality of reading operations.

9. A method of driving an imaging device according to claim 8, wherein the plurality of reading operations are performed within a blanking period in a television system.

10. A solid-state imaging device comprising:

a plurality of photoelectric converting sections; and charge transfer means, including a plurality of vertical charge transfer sections, for transferring a plurality of charges read from each of the photoelectric converting sections to a plurality of receiving elements, wherein a first reading operation is performed for providing a first charge accumulated in at least one photoelectric converting section to the charge transfer means, a second reading operation is performed for providing a second charge accumulated in the at least one photoelectric converting section to the charge transfer means, the first and second charges remain separate within the charge transfer means, the first and second charges each held in a respective one of said vertical charge transfer sections simultaneously, and wherein the first charge provided by the first reading operation and the second charge provided by the second reading operation are transferred from the charge transfer means to the receiving elements substantially simultaneously without transferring the first and second charges between the first reading operation and the second reading operation, the first charge is transferred separately from the second charge to the receiving elements.

11. A solid-state imaging device according to claim 10, wherein the charges from fewer than all of the photoelectric converting sections are transferred to the charge transfer means in at least one of the reading operations.

12. A solid-state imaging device according to claim 10, wherein charges from all of the photoelectric converting sections are transferred to the charge transfer means in each of the reading operations.

13. A solid-state imaging device according to claim 10, wherein the steps of performing the first read operation and performing the second read operation are each performed on both a second photoelectric converting section and a third photoelectric converting section, wherein the second and third photoelectric converting sections are adjacent, further comprising the step of mixing together the first and second charges from the adjacent second and third photoelectric converting sections in the charge transfer means.

14. A solid-state imaging device according to claim 10, wherein a third read operation is performed on the at least one photoelectric converting section, wherein a third charge accumulated in the at least one photoelectric converting section is provided to the charge transfer means;

a fourth read operation is performed on the at least one photoelectric converting section, wherein a fourth charge accumulated in the at least one photoelectric converting section is provided to the charge transfer means;

the third and fourth charges are combined; and the combined third and fourth charges are transferred from the charge transfer means to the receiving elements.

15. A solid-state imaging device according to claim 10, wherein the photoelectric converting sections are provided with color filters different spectroscopic characteristics from one another.

16. A solid-state imaging device according to claim 10, wherein an image for one image plane is scanned within one field in a television scanning system.

17. A solid-state imaging device according to claim 10, wherein the imaging device is irradiated by light for different time durations for the plurality of reading operations.

18. A solid-state imaging device according to claim 17, wherein the plurality of reading operations are performed within a blanking period in a television system.

* * * * *

UNITED STATES PATENT AND TRADE MARK OFFICE
CERTIFICATE OF CORRECTION

PATENT NO.  : 5,966,174
DATED       : October 12, 1999
INVENTOR(S) : Yamamoto et al.

It is certified that error appears in the above-identified patent and that said Letters Patent is hereby corrected as shown below:

At Column 16, line 21, after "the" insert --at--.

At Column 16, line 31, after "filters" insert --having--.

Signed and Sealed this

Twenty-eighth Day of November, 2000

Attest:

Q. TODD DICKINSON

*Attesting Officer*    *Director of Patents and Trademarks*